United States Patent [19]

Hatakeyama et al.

[11] Patent Number: 4,916,330
[45] Date of Patent: Apr. 10, 1990

[54] SIGNAL LEVEL TRANSFORMING CIRCUIT

[75] Inventors: Akira Hatakeyama, Okazaki; Takeshi Nakane, Ichinomiya, both of Japan

[73] Assignee: Aisin Seiki Kabushiki Kaisha, Aichi pref., Japan

[21] Appl. No.: 249,157

[22] Filed: Sep. 26, 1988

[30] Foreign Application Priority Data

Sep. 25, 1987 [JP] Japan .................. 62-241330

[51] Int. Cl.⁴ .................. H03K 5/153; H03K 3/29; H03L 5/00
[52] U.S. Cl. .................. 307/264; 307/475; 307/290; 307/359; 307/350
[58] Field of Search .................. 307/264, 299.3, 475, 307/290, 350, 359, 362

[56] References Cited

U.S. PATENT DOCUMENTS 4,525,638  6/1985  Gray .................. 307/350
4,684,877  8/1987  Shreve et al. .................. 307/299.3

FOREIGN PATENT DOCUMENTS 58-162124  9/1983  Japan .

Primary Examiner—Stanley D. Miller
Assistant Examiner—Timothy P. Callahan
Attorney, Agent, or Firm—Sughrue, Mion, Zinn, Macpeak & Seas

[57] ABSTRACT

A signal level transforming circuit includes a constant current circuit for supplying a constant current corresponding to a power voltage of an input signal to an electrical line connected between an output terminal connected with an input terminal via an input resistor and a common voltage level terminal, a low level clamping circuit for clamping the minimum value of the voltage at the output terminal to a first low level voltage, a voltage generating circuit for generating a constant voltage so as to transform a voltage signal in the input terminal into a binary signal, and a comparing circuit having a hysteresis characteristic and including a multi-collector type transistor having one collector connected with a voltage output terminal in the voltage generating circuit via a resistor for setting a comparing voltage, and having another collector connected to the output terminal, and a transistor inserted between a base of the multi-collector type transistor and the resistor for setting a comparing voltage and for turning ON when the voltage at the input terminal exceeds the voltage in the resistor.

4 Claims, 3 Drawing Sheets

SIGNAL LEVEL TRANSFORMING CIRCUIT

FIELD OF THE INVENTION

This invention relates generally to signal level transforming circuits for transforming a relatively high level voltage signal into a preset low level voltage signal, and more particularly, to a signal level transforming circuit for transforming a relatively high level voltage signal into a binary signal voltage of a preset low level voltage.

BACKGROUND OF THE INVENTION

Generally, in the electrical control of a device in a motor vehicle, a voltage from a battery (for example a 12 Volt or 24 Volt battery) is supplied to a sensor switch or to a driving circuit for the device whereby a detected signal or a feedback signal in this voltage level is obtained. This signal is transformed into a binary signal, for example, a 5 Volt binary signal so as to supply and operate a microprocessor for controlling the device. Therefore, it is required that a relatively high level signal voltage formed in accordance with the voltage from the battery is transformed into a relatively low level voltage signal for application to the microprocessor.

A prior art signal level transforming circuit is disclosed in Japanese Patent Laid-open No. 58(1983)-162124 published on Sept. 26, 1983. The basic structure of the signal level transforming circuit of this prior art reference is shown in FIG. 3. In FIG. 3, the signal level transforming circuit comprises a high voltage level signal input terminal VIN, a high voltage supply terminal VB connected with a 12 Volt battery (not shown), a low voltage supply terminal VCC connected with a low voltage source (not shown) for supplying a constant 5 Volt voltage, a ground terminal GND, a low voltage level signal output terminal VA, a first constant current circuit CCf, a low voltage clamping circuit LVc (R5, R6, Q3, D1), a high voltage clamping circuit HVc (R3, R4, Q4, Q5), a second constant current circuit CCs, and a comparing circuit VCP. FIGS. 4A and 4B show an input-output characteristic of the signal level transforming circuit.

The second constant current circuit CCs and the comparing circuit VCp form a hysteresis circuit A1. The hysteresis circuit A1 outputs a preset constant current I16 when a voltage at the signal output terminal VA reaches a standard value. A constant current IE6 flowing through a transistor Q6 in the first constant current circuit CCf is indicated as follows: IE6=IA (constant). Namely, any current larger than the constant current IE6 does not flow into the transistor Q6. Therefore, the constant current I16 flows into a resistor RA, so a current flowing through resistor RA is indicated as (IA-I16). An output voltage VA appearing at signal output terminal VA is indicated as follows:

$$VA = VIN - (IA - I16)RA$$
$$= VIN - (IA \times RA) + (I16 \times RA)$$

Therefore, the output voltage VA increases by I16×RA. This voltage I16×RA is a hysteresis-up voltage Vo. The output voltage VA changes in response to an input voltage VIN because I16 is a constant current.

When the input voltage VIN drops to V2 from V3, the output voltage VA drops to VA3 in response to input voltage VIN due to the reason described above. When the output voltage VA drops to VA3, the supply of constant current I16 from transistor Q6 is stopped whereby the value of $I16 \times RA = Vo$ changes to 0 (zero), the output voltage VA rapidly drops to $VA = VIN - IA \times RA = VA2$. When the output voltage VA drops to VA1 from VA2, the output voltage VA drops in response to the decrease of input voltage VIN because IA=IE6 is constant in the above-described formula $VA = VIN - IA \times RA$. In FIG. 4A, when the input voltage VIN drops to V2 from V3, the output voltage VA drops to VA3 from VA4 in response to the change of input voltage VIN. The output voltage VA is in direct proportion to the input voltage VIN, so the gradient of the straight line which indicates a relationship between input voltage VIN and output voltage VA is $(VA4-VA3)/(VA4-VA3)=1/1$, therefore, the hysteresis-up voltage Vo equals to a hysteresis width VH.

However, when the hysteresis-up voltage Vo equals the hysteresis width VH, a problem occurs as follows: It is that if the hysteresis-up voltage Vo increases extremely, the hysteresis width VH' expands as shown in FIG. 4B. In FIG. 4B, for example, if VA2 and VA3 are 0.8 Volt and 4 Volt respectively, the hysteresis-up voltage Vo is (VA3-VA2) -3.2 Volt. Therefore, as described above, the hysteresis width VH is also 3.2 Volt due to Vo=VH. If this situation occurs, there are not any problems with respect to the output signal voltage VA rapidly rising up to VA3 from VA2, however, when the output signal voltage VA drops to VA2 after it rises up to VA3, the distinction of the binary signal from the output signal voltage VA with respect to the input signal voltage VIN in this part cannot be certain because the output signal voltage VA drops in response to the input signal voltage VIN. Consequently, in this part, if the output signal voltage VA changes due to the change of input signal voltage VIN based on the change of battery voltage, there is a possibility that the microprocessor may make an error in its operation. Furthermore, in prior art signal level transforming circuit, there are defects in that the circuit structure is complex and the number of circuit components is large.

SUMMARY OF THE INVENTION

The present invention has solved the foregoing disadvantages in the prior art. Therefore, the objects of the present invention are to provide a signal level transforming circuit, wherein the distinction of the binary signal is accomplished accurately and easily, the circuit structure is relatively simple, and the number of circuit components is relatively few.

The present invention accomplishes these objects by providing a signal level transforming circuit which is constructed as follows: a constant current circuit for supplying a constant current corresponding to a power voltage of an input signal to an electrical line connected between an output terminal which is connected with an input terminal via an input resistor and a common voltage level terminal, a low level clamping circuit for clamping the minimum value of the voltage in the output terminal to a first low level voltage, a standard voltage generating circuit for generating a constant voltage so as to transform a voltage signal in the input terminal into a binary signal, and a comparing circuit having a hysteresis characteristic and including a multi-collector type transistor having one collector connected with a standard voltage output terminal in the standard voltage generating circuit via a resistor for setting a comparing voltage and another collector connected with the output terminal, and a transistor inserted between the base of the multi-collector type transistor and the resistor for setting the comparing voltage and which turns ON when the voltage at the input terminal exceeds the voltage across the resistor.

The operation of the constant current circuit and low voltage clamping circuit is similar the above-described prior art first constant current circuit CCf and low voltage clamping circuit LVc, respectively, and therefore, in this part, the operation of the standard voltage generating circuit (RVg in FIG. 1) and the comparing circuit (VCm in FIG. 1) having the hysteresis characteristics will be explained.

When an input voltage VIN applied to the input terminal VIN rises up to a standard voltage V2, a transistor Q5 in comparing circuit VCm turns ON whereby the multi-collector type transistor Q6 turns ON and a current I6 is supplied to the output terminal VA. By the current I6, a voltage VA at output terminal VA rises up to VA3, and a comparing voltage for transforming the voltage into a binary signal rises up from the standard voltage VCC×R7/(R6+R7) to VCC−VCE6. The value of VCC−VCE6 is equal to the value of VCC (5 Volt) minus the voltage between collector and emitter in transistor Q6. The value of VCC−VCE6 corresponds to V4 in FIG. 2. Therefore, after then, when the input voltage VIN drops below V4, namely, when the output voltage VA drops below VA5 (if over VA5, it represents a "1" in a binary signal), the transistor Q5 turns OFF and the output voltage VA changes to a low clamping voltage VA1 ("0" in a binary signal). As noted above, the input voltage VIN is changed to the binary signal at V2, the output voltage VA changes to a voltage higher than VA5 under the high level 1 in a binary signal and a voltage VA1 under the low level 0 in a binary signal.

When the input voltage VIN rises up gradually in an area greater than V2, the output voltage VA is represented as follows:

$$VA = VIN - RA(IE2 - I6) \quad (8)$$

However, if IA increased in response to an increase of VIN, I6 is decreased in response to an increase of IA, and an increasing amount of IA is larger than a decreasing amount of I6, therefore, a value of (IE2−I6) in formula (8) noted above decreases gradually little by little whereby the value of VA increases gradually. An increasing gradient of VA in the condition is able to control by adjusting the value of input resistor RA and/or power supply input resistor R5, therefore, it is able to clamp the output voltage VA into upper clamping by using this characteristic.

By that the transistor Q6 is turned ON at input voltage VIN which is higher than V2, and the comparing voltage VC at point c for deciding ON/OFF of transistor Q5 changes from VCC×R7/(R6+R7) corresponding to V2 into $$VC = VCC - VCE6 \quad (10)$$

VC=VCC−VCE6 corresponds to V4 (VA5). VCE6 represents a voltage between a collector and an emitter in transistor Q6.

When the input voltage VIN drops to V4 from V2 whereby the output voltage VA is dropped to VA5 from VA3, the transistor Q5 is turned OFF and the transistor Q6 is also turned OFF. Accordingly, since the current I6 supplied to the output terminal VA from the transistor Q6 has disappeared, the value of output voltage VA drops to VA1 rapidly. The value of VA1 in such time is represented as follows:

$$VA5 = VCC - VCE6 + VBE5 \quad (11)$$

VBE5 represents a voltage between a base and an emitter in transistor Q5.

VCE6 changes in response to the change of voltage VA at output terminal VA, for example, when the output voltage VA is 5 Volt (VCC=5V). VCE6 changes in an area from 1.3 V through 1.7 V, and the value of VCE6 decreases in response to an increase of the output voltage VA. When the output voltage VA drops to VA1, the low clamping circuit LVc holds VA1 under that the input voltage VIN is lower than V1.

A hysteresis-up voltage Vo is represented as follows:

$$Vo = VA3 - VA2 \quad (12)$$
$$= (VCC - VCE6) \times RA/(RA + R9)$$

A hysteresis width VH is decided by the value of the voltage supplied from the transistor Q6, and therefore, the hysteresis width VH expands if RA is changed to a high value or R9 is changed to a low value. However, by a resistor R8 for setting a standard voltage, the comparing voltage VC at the point C is shifted by the switching operation of transistor Q6, and therefore, the expansion of the hysteresis width VH is limited.

Consequently, in distinguishing the output voltage VA to a binary signal, even from a low level, for example, lower than 0.8 Volt to a high level, for example, higher than 4 Volt, as noted above, according to the present invention, the transforming circuit is able to distinguish a binary signal without an out of shape hysteresis as in the prior art transforming circuit of FIG. 3. Accordingly, the signal level transforming circuit according to the present invention is able to accurately distinguish a binary signal at upper and lower areas in a threshold voltage of C-MOS and N-MOS devices, and therefore is useful as an interface of both C-MOS and N-MOS devices.

BRIEF DESCRIPTION OF THE DRAWINGS

Various other objects, features and attendant advantages of the present invention will be more fully appreciated as the same becomes better understood from the following detailed description when considered in connection with the accompanying drawings, wherein.

DETAILED DESCRIPTION OF THE PREFERRED EMBODIMENTS

Figure 1:
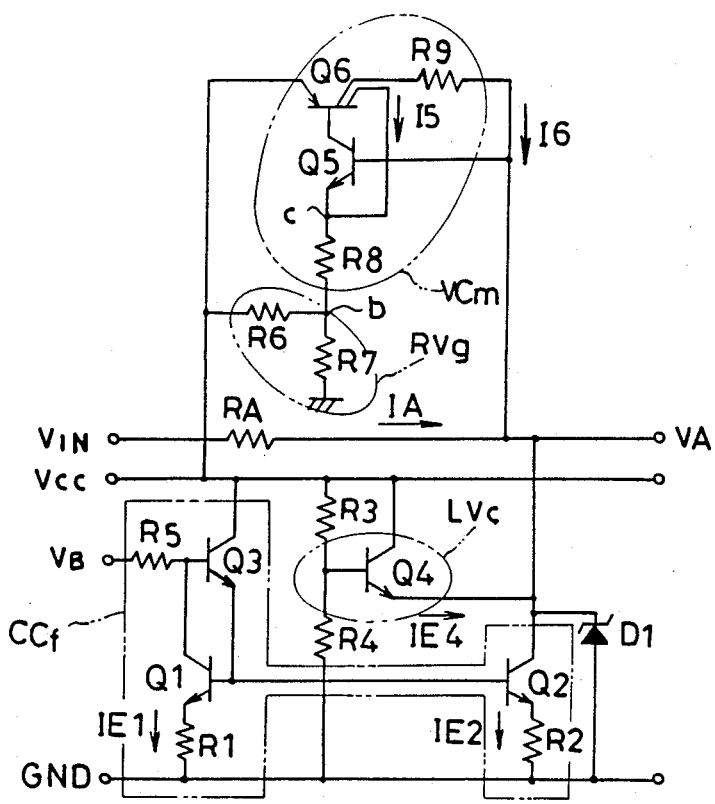
FIG. 1 is an electric circuit diagram of the present invention.

Referring now to the drawings, there is shown in FIG. 1, a so-called signal level transforming circuit including an input terminal VIN which is supplied with an input signal voltage VIN from a sensing switch (not shown) connected to a 5 Volt power supply. The input signal voltage VIN is connected with an output terminal VA via an input resistor RA and is transformed into a voltage of a 5 Volt level through input resistor RA, and after then, it is supplied from the output terminal VA to a microprocessor (not shown) which is an electrical device of a 5 Volt level. A power supply of input signal voltage VIN is a 12 Volt or 24 Volt battery (not shown) mounted on a motor vehicle body (not shown), a high voltage supply terminal VB is supplied with a battery voltage VB from the battery. The battery is also connected to a constant voltage circuit (not shown) whereby this constant voltage circuit supplies a low constant voltage VCC (5 Volt) to a low constant voltage supply terminal VCC. A transistor Q2 and a resistor R2 for supplying a constant current in a constant current circuit CCf are inserted into an electrical line between the output terminal VA and a common voltage (ground) GND. A current is supplied to the transistor Q2 from low constant voltage supply terminal VCC through a transistor Q4. A zener diode D1 is connected in parallel with transistor Q2 and resistor R2 of constant current circuit CCf. A voltage Vcc×R4/(R3+R4) divides the low constant voltage VCC by resistors R3 and R4, for example, 1 Volt is supplied to transistor Q4. By an input of input signal voltage VIN, when a voltage in output terminal VA rises up over 0.8 Volt (VA2 of FIG. 2), a voltage VA is changed to a voltage of a high level "1" of a binary signal which is over 4 Volts (VA5). On the other hand, when the voltage at output terminal VA drops to below 4 Volts (VA5 of FIG. 2), the voltage VA changes to voltage VA1 of a low level "0" in a binary signal which is below 0.8 Volt (VA2). Therefore, the output voltage VA is changed into a binary signal of a TTL level.

In the constant current circuit CCf, transistors Q1, Q3 and resistors R1 and R2 are connected with a transistor Q2, and the battery voltage VB is supplied to a resistor R5. The output terminal VA is connected to a comparing circuit VCm, and an emitter of transistor Q5 in comparing circuit VCm is connected with a standard voltage output terminal b in a standard voltage generating circuit RVg via a resistor R8 for setting a comparing voltage.

A transistor Q6 in comparing circuit VCm is a multi-collector type, wherein one of the collectors is connected to the output terminal VA via a resistor R9, and the other collector is connected to a comparing voltage terminal c. A voltage $Vb=VCC\times R7/(R6+R7)=0.3V$ appears at the standard voltage output terminal b. VCC (5 V) is supplied to an emitter in transistor Q6.

Figure 2:
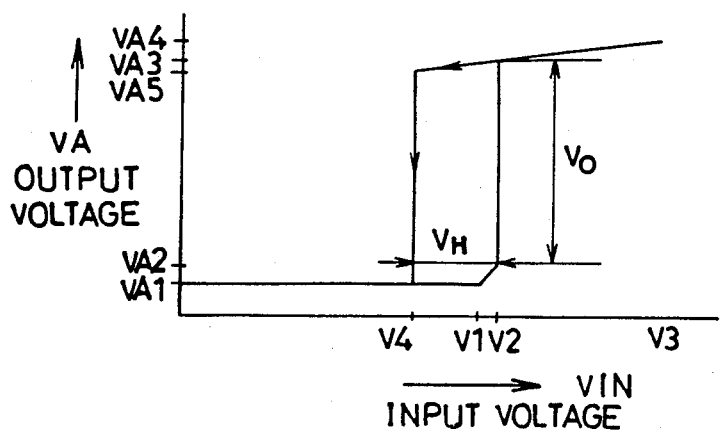
FIG. 2 is a graph showing a characteristic of the input and output voltages in the electric circuit in FIG. 1.
Figure 3:
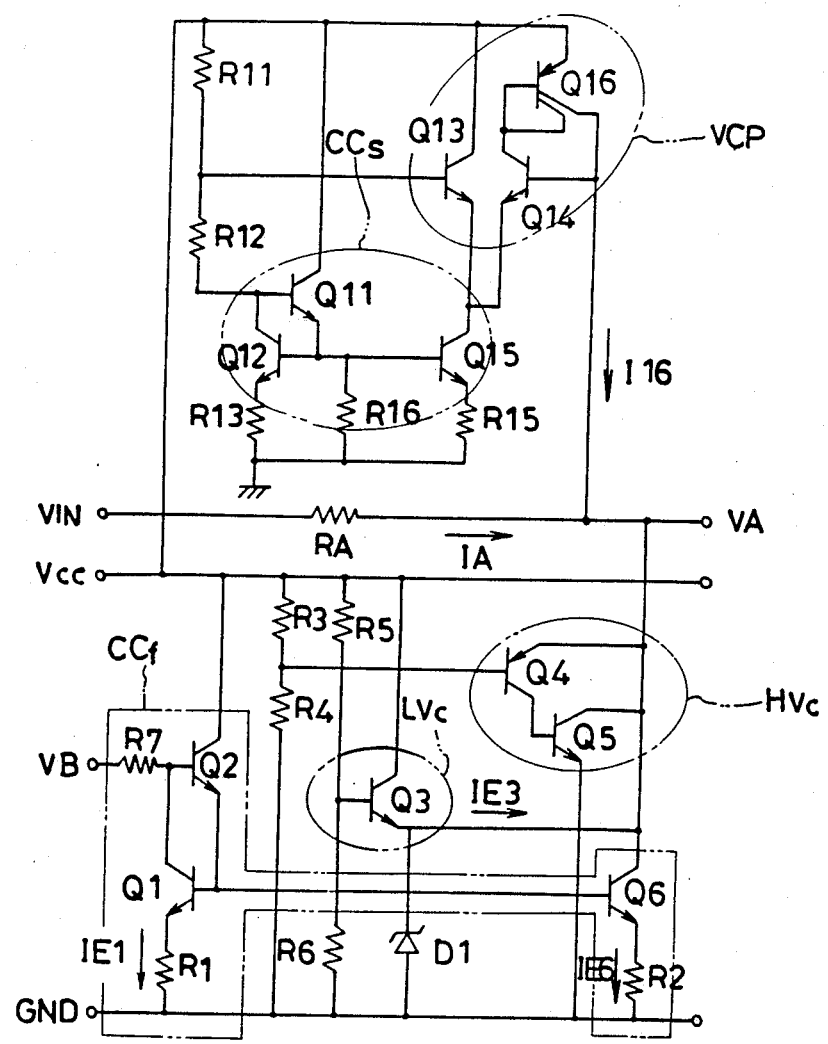
FIG. 3 is an electric circuit diagram of a prior art transforming circuit.
Figure 4A:
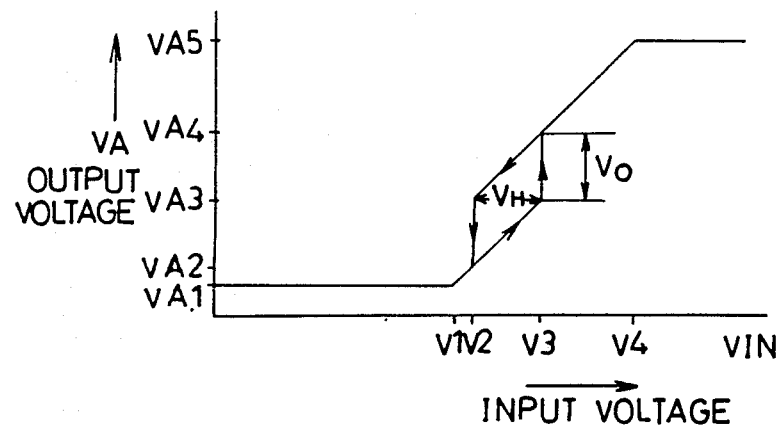
FIGS. 4A and 4B are graphs, each showing a characteristic of input and output voltages in the electric circuit of FIG. 3.
Figure 4B:
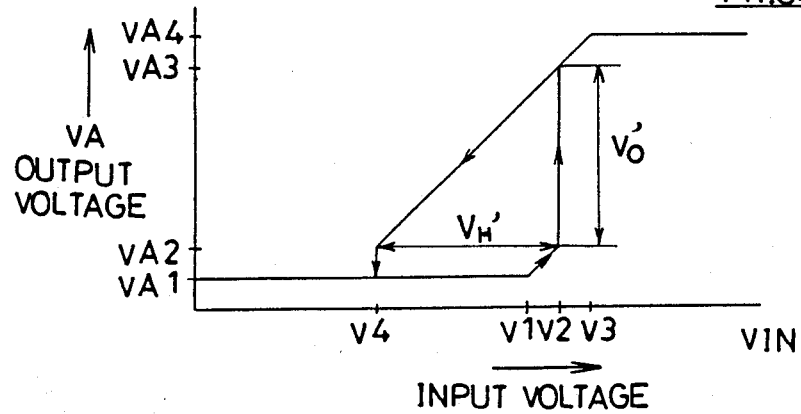

The input and output signal level characteristics of the transforming circuit in FIG. 1 is shown in FIG. 2. When the input signal voltage VIN is below V1, the voltage VA in output terminal VA is kept to VA1, for example, 0.4 V. An emitter current IE1 of transistor Q1 in constant current circuit CCf is indicated as follows:

$$IE1=(VB-VBE3)/(R1+R5) \quad (1)$$

VBE1 and VBE3 represent the voltages between the base and the emitter of transistor Q1 and Q3, respectively. Since the bases of the transistors Q1 and Q2 are connected to each other, if a voltage between the base and the emitter in transistor Q1 is equal to that in transistor Q2, a value of emitter current IE2 of transistor Q2 for constant current output is indicated as follows:

$$IE2=R1\times IE1/R2 \quad (2)$$

This emitter current IE2 is a constant current and is the sum of the current IA by input signal voltage VIN and a current IE4 supplied from a transistor Q4 in a low clamping circuit LVc. The current IA increases in response to input signal VIN, the current IE4 decreases in response to an increase of current IA and IA increases to IA=IE2. Therefore, when approaching IA=IE2, the value of output voltage VA is indicated as follows:

$$VA=(R2\times IA)+VCE2 \quad (3)$$

VCE2 represents a saturated voltage between the collector and emitter in transistor Q2. For example, under VIN=0, if the emitter current IE4 flows into transistor Q6, the output voltage VA is indicated as follows:

$$VA=VCC\times R4/(R3+R4)-VBE4 \quad (4)$$

VBE4 represents a voltage between the base and emitter of transistor Q4. In that condition, even if a common voltage level (ground voltage level) changed whereby the input signal voltage rises up under no input signal, the output voltage VA keeps the output voltage VA1 at a low level 0 during it reaches to IE=IA2. On the other hand, when a minus voltage is applied to the input terminal VIN. VA is indicated as follows:

$$VA=IA\times RA-VIN \quad (5)$$

Therefore, by that IA increases in response to an increase of VIN whereby the output voltage VA is kept to a constant value, the output voltage VA is kept in the output voltage VA1 at a low level 0. The transistors Q5 and Q6 in the comparing circuit VCm are for obtaining the hysteresis characteristic. In FIG. 2, when the input signal voltage VIN increases to V2 from V1, the current IA flowing into transistor Q2 is indicated as follows:

$$IA=IE2 \quad (6)$$

By that IE2 is a constant current, IA could not reach over the value of IE2. Therefore, the value of output voltage VA is indicated as follows:

$$VA=VIN-(IE2\times RA) \quad (7)$$

By that IE2 is a constant current, the value of the output voltage VA increases in response to an increase of input signal voltage VIN.

When the input voltage VIN reaches V2 corresponding to the standard voltage Vb, the transistor Q5 turns ON whereby transistor Q6 is also turned ON, and whereby a current 16 is supplied to the output terminal VA from collector of transistor Q6 via a resistor R9. Therefore, the output voltage VA is indicated as follows:

$$VA=VIN-RA(IE2-I6) \quad (8)$$

In this manner, the output voltage VA rises up rapidly and reaches VA3. In such time, the output voltage VA2 corresponding to the preset standard voltage Vb is indicated as follows:

$$VA2 = Vb - VBE5 \qquad (9)$$
$$= VCC \times R7/(R6 + R7) - VBE5$$

VBE5 represents a voltage between the base and emitter in transistor Q5. In an area from V2 to V3 of the input signal voltage VIN, if IA increases in response to an increase of VIN, I6 is decreased in response to increasing of IA, and an increasing amount of IA is larger than a decreasing amount of I6, and therefore, a value of (IE2−I6) in formula (8) noted above decreases gradually little by little whereby the value of VA increases gradually. An increasing gradient of VA in the condition is able to control by adjusting the value of input resistor RA and/or power supply input resistor R5, and therefore, it is able to clamp the output voltage VA into upper clamping by using this characteristic. For example, it is able to clamp the output voltage VA within 5 Volt under that the input signal voltage VIN is in the battery voltage VB. A zener diode D1 for protecting the circuit if an excessive voltage which is higher than battery voltage VB, for example, a surge voltage of 300 Volt is supplied to the input signal voltage VIN, is connected in respect to the transistor Q2 in parallel. Therefore, even if a battery voltage VB increases or a surge voltage is supplied, the circuit is protected. If the battery voltage VB is raised up, an emitter current IE1 in transistor Q1 is increased whereby IE2 also decreases in response to the decrease of IE1, so that the decrease of the output voltage VA by decreasing the battery voltage VB is prevented.

When the input signal voltage VIN is within V2 and V4, transistors Q5 and Q6 are turned ON, and therefore a collector current in transistor Q6 is supplied in respect to a comparing voltage terminal c whereby a voltage is generated at a resistor R8 and whereby a voltage Vc at comparing voltage terminal c is kept at a voltage which is higher than the voltage Vb at the standard voltage terminal b. Namely, the voltage Vc is indicated as follows:

$$VC = VCC - VCE6 \qquad (10)$$

VCE6 represents a voltage between the collector and emitter of multi-collector type transistor Q6. When the input voltage VIN drops to V4 from V2 whereby the output voltage VA is dropped to VA5 from VA3, the transistor Q5 is turned OFF whereby also the transistor Q6 is turned OFF. Accordingly, by that the current I6 supplied to the output terminal VA from the transistor Q6 has disappeared, the value of output voltage VA drops to VA1 rapidly according to the formula (8) noted above. The value of VA5 in such time is represented as follows:

$$VA5 = VCC - VCE6 + VBE5 \qquad (11)$$

VBE5 represents a voltage between the base and emitter in transistor Q5.

VCE6 changes in response to the change of voltage VA at output terminal VA, for example, when the output voltage VA is 5 Volt (VCC=V5), VCE6 changes in an area from 1.3 V through 1.7 V, and the value of VCE6 decreases in response to an increase of the output voltage VA. When the output voltage VA drops to VA1, the low clamping circuit LVc holds VA1 under that the input voltage VIN is lower than V1.

A hysteresis-up voltage Vo is represented as follows:

$$Vo = VA3 = VA2 \qquad (12)$$
$$= (VCC - VCE6) \times RA/(RA + R9)$$

A hysteresis width VH is decided by the value of voltage supplied from the transistor Q6, and therefore the hysteresis width VH expands if RA changes to a high value or R9 changes to a low value. However, by a resistor R8 for setting a comparing voltage, the comparing voltage VC is shifted to a voltage higher than the standard voltage Vb by the switching operation of transistor Q6, and therefore, the expansion of the hysteresis width VH is limited.

Consequently, in distinguishing the output voltage VA into a binary signal, even from a low level, for example, lower than 0.8 Volt to a high level, for example, higher than 4 Volt, as noted above, according to the present invention, the circuit is able to distinguish a binary signal without the out of shape hysteresis associated with the prior art. Accordingly, the signal level transforming circuit according to the present invention is able to accurately distinguish a binary signal at upper and lower areas in a threshold voltage of C-MOS and N-MOS devices and therefore is useful as an interface for both C-MOS and N-MOS devices.

As noted above, according to the present invention, when the input signal voltage VIN rises up over V2 corresponding to the standard voltage $Vb = VCC \times R7/(R6+R7)$, transistors Q5 and Q6 in comparing circuit VCm are turned ON whereby the output voltage VA rises up to VA3 from VA2, and whereby the comparing voltage in comparing circuit VCm rises up from the standard voltage Vb to $VC = VCC - VEC6$, and therefore the expansion of the hysteresis width VH is limited by the amount of rising up in the comparing voltage whereby the minimum value VA5 of the high level of a binary signal in output voltage VA is able to set in high relatively wherein the output voltage VA changes to low level in binary signal from high level in binary signal.

Namely, in the preferred embodiment, when the input signal voltage VIN is changed to V2, the output voltage VA rises up to VA3 (4 V, in such time, the comparing voltage $Vc = VCC - VEC6 - 3.5V$) rapidly from VA2 (0.8 V, in such time, the comparing voltage $Vc = Vb - 0.3V$), and when the input signal voltage VIN is changed to V4 (output voltage VA5=3.5V), the output voltage VA drops to VA1 (0.5 V). With respect to the change of input signal voltage VIN, the output voltage VA generates only two voltages which are less than 0.8 V (low level 0 in binary signal) and higher than 3.5 V (high level 1 in binary signal) whereby the difference between the two voltages in the output voltage VA is able to set in large, therefore, distinguishing a binary signal is accurately accomplished.

Those skilled in the art will understand that many modifications and variations of the present invention are possible in light of above teachings. It is therefore to be understood that within the scope of the appended claims the invention may be practiced otherwise than as specifically described herein.

What is claimed is:

1. A signal level transforming circuit operative to transform an input signal into a binary signal comprising:

an input terminal;

an input resistor;

an output terminal connected to said input terminal via said input resistor;

a common voltage level terminal;

a constant current circuit, having a power supply terminal, for supplying a constant current corresponding to the voltage of said terminal, power supply said circuit being connected between said output terminal and said common voltage level terminal;

a zener diode, connected to said output terminal and across said constant current circuit to protect said constant current circuit against overload;

a low level clamping circuit for clamping the minimum value of the output voltage at said output terminal to a first voltage at a low level;

a voltage generating circuit having an input terminal and a voltage output terminal and being operable for generating a constant voltage; and a comparing circuit having a hysteresis characteristic and comprising a setting resistor, a multi-collector type transistor having an emitter connected to said input terminal of said voltage generating circuit, one collector connected with the voltage output terminal in said voltage generating circuit via said setting resistor for setting a comparing voltage, and having another collector connected to said output terminal, said comparing circuit further including a first transistor inserted between a base of said multi-collector type transistor and said setting resistor, said first transistor having its base connected to said output terminal and being operative to turn ON when the voltage at said input terminal exceeds the voltage across said setting resistor.

2. The signal level transforming circuit of claim 1, further comprising a low constant voltage supply terminal and wherein the emitter of said multi-collector type transistor is connected to said low constant voltage supply terminal.

3. The signal level transforming circuit of claim 2, wherein said voltage generating circuit comprises a first resistor and a second resistor, said first resistor being connected to said second resistor, said first resistor also being connected to said supply terminal.

4. The signal level transforming circuit of claim 2, wherein said low level clamping circuit further comprises a second transistor having its base and collector connected to said supply terminal and its emitter connected to the collector of a constant current circuit's transistor that is in parallel to the zener diode.

* * * * *